US006184460B1

(12) United States Patent
Bertoncini

(10) Patent No.: US 6,184,460 B1
(45) Date of Patent: *Feb. 6, 2001

(54) MODULAR BOX SHIELD FOR FORMING A COAXIAL HEADER

(75) Inventor: Daniel B. Bertoncini, Mechanicsburg, PA (US)

(73) Assignee: Berg Technology, Inc., Reno, NV (US)

( * ) Notice: This patent issued on a continued prosecution application filed under 37 CFR 1.53(d), and is subject to the twenty year patent term provisions of 35 U.S.C. 154(a)(2).

Under 35 U.S.C. 154(b), the term of this patent shall be extended for 0 days.

(21) Appl. No.: 09/032,439

(22) Filed: Feb. 27, 1998

(51) Int. Cl.[7] .......... H05K 9/00

(52) U.S. Cl. .......... 174/35 R; 174/65 R; 361/816; 361/818; 439/579; 439/607; 439/608; 439/609; 439/610

(58) Field of Search .......... 174/35 R, 65 R; 361/816, 818; 336/92; 333/12; 439/607–610, 579

(56) References Cited

U.S. PATENT DOCUMENTS

| | | | | |
|---|---|---|---|---|
| 4,571,014 | | 2/1986 | Robin et al. | 339/14 R |
| 4,632,476 | | 12/1986 | Schell | 339/14 R |
| 4,975,066 | | 12/1990 | Suchaski et al. | 439/63 |
| 5,238,414 | | 8/1993 | Yaegashi et al. | 439/108 |
| 5,527,189 | * | 6/1996 | Middlehurst et al. | 439/608 |
| 5,597,326 | * | 1/1997 | DeLessert et al. | 439/608 |
| 5,620,340 | | 4/1997 | Andrews | 439/608 |
| 5,782,656 | * | 7/1998 | Zell et al. | 439/579 |

* cited by examiner

*Primary Examiner*—William A. Cuchlinski, Jr.
*Assistant Examiner*—Ronnie Mancho
(74) *Attorney, Agent, or Firm*—Brian J. Hamilla; M. Richard Page

(57) ABSTRACT

An electrical shield is disclosed for shielding a conductor. The shield includes a top wall having an opening formed therein for the conductor. A first wall, integrally formed with the top wall includes first and second panels. One edge of the first panel is attached to the top wall and one edge of the second panel is attached to the first panel. A lead is integrally formed with the first panel. A second wall is also integrally formed with the top wall, so that a cavity is defined by the top wall, the first and second panels and the second wall. In a preferred embodiment, the shield further includes third, fourth and fifth walls, integrally formed with the top wall. The third wall includes third and fourth panels, wherein one edge of the third panel is attached to the top wall and wherein one edge of the fourth panel is attached to the third panel. In such an embodiment, a second cavity is defined by the top wall and the second, third and fourth panels and a third cavity is defined by the top wall, the fourth panel, the fourth wall and the fifth wall. Since the cavities each include only three walls, however, when several shields are positioned in abutting relationship to one another, a wall of one shield is located in the cavity opening of an adjacent shield, thereby closing the cavity.

14 Claims, 5 Drawing Sheets

MODULAR BOX SHIELD FOR FORMING A COAXIAL HEADER

FIELD OF THE INVENTION

The present invention relates to electrical connectors, and more particularly, to a multi-pin header for use in a connector system wherein each pin in the header is electrically isolated in a coaxial manner.

BACKGROUND OF THE INVENTION

Continued advances in the design of electronic devices for data processing and communications systems is placing rigorous demands on electrical connectors. Specifically, electrical connectors providing greater density and isolation for signal transmission are needed for design advances which increase integration of solid state devices and which increase the speed of data processing and communication. Designing connectors to have higher degrees of isolation requires careful consideration of the problems which result from decreasing the distance between contacts in order to increase density. Primarily, as the distance between contacts decreases, the likelihood of undesirable electrical cross talk between contacts increases.

As more functions become integrated on semiconductor chips or on flexible circuit substrates and more chips are provided on printed circuit boards (PCBs), each PCB or flexible circuit must provide more inputs and outputs (I/Os). The demand for more I/Os directly translates to a demand for greater density. In addition, many system components are capable of operation at faster speeds than previously. Faster speed can result in the generation of potentially interfering signals, i.e., signals which can cause crosstalk and noise. The connectors used in such high-speed board-to-board, board-to-cable and cable-to-cable communications may be treated for design purposes like transmission lines in which crosstalk and noise become significant concerns. Indeed, the electrical performance of high-speed board-to-board, board-to-cable and cable-to-cable communications is dependent upon the amount of crosstalk and noise introduced at the connector interface.

As was recognized in U.S. Pat. No. 4,824,383—Lemke, incorporated herein by reference, an important connector design consideration is the provision of an electrical connection while avoiding degradation of component performance. Prior to this patent, connector designs had been proposed in which a ground plane and alternating ground contacts together with shielding extensions were introduced to minimize electrical discontinuities, i.e., crosstalk and noise. While performance was controlled in such prior devices, density was limited.

U.S. Pat. No. 4,824,383 proposed designs for plug and receptacle connectors for multiple conductor cables or multiple trace substrates. In such designs individual contact elements or groups of contact elements were electrically isolated to prevent or minimize crosstalk and signal degradation. In the individually isolated design, a conductive base plate was provided with a number of walls arranged in side-by-side relationship, thereby defining a number of channels. A contact support member formed from electrical insulating material was designed to have a number of fingers, wherein a finger was positioned within each channel. Each finger of the contact support member supported an individual contact element.

Although, the connectors disclosed in U.S. Pat. No. 4,824,383 increased contact element density, industry driven density demands continued to grow. U.S. Pat. No. 5,057, 028—Lemkeetal. and U.S. Pat. No. 5,169,324—Lemke et al. (now U.S. Pat. No. Re. 35.508), all incorporated herein by reference, disclose two row plug and receptacle connectors for attachment to printed circuit boards (PCBs), so that when such connectors are mated the PCBs are electrically interconnected. Although, these plug and receptacle systems provide higher contact density, electrical isolation is provided primarily between sets of contacts rather than between individual contacts.

In an attempt to provide isolation between individual contacts, various design schemes have been proposed. These design schemes can be generally catagorized as a coaxial structure (a single contact surrounded by a conductor), as a twinax structure (dual contacts surrounded by a conductor), as a microstrip structure (a number of contacts provided on one side of a single ground plane), and as a stripline structure (a number of contacts sandwiched between two ground planes.

U.S. Pat. Nos. 4,846,727, 5,046,960, 5,066,236, 5,104,341, 5,496,183, 5,342,211 and 5,286,212 disclose various forms of stripline structures incorporated into a plug and receptacle system. Generally, however, these systems can be described as providing columns of contact elements having conductive plates disposed between each column. The connectors are designed so that the plug and receptacle ground plates contact one another. A further aspect of this system is the modular design of the receptacle. Each row of receptacle contact elements are molded into a frame of dielectric material. The overall receptacle assembly, thus includes, a housing to which the ground plates and dielectric frames are attached in alternating layers. Outer shields are also disclosed for surrounding the receptacle exterior. One of the problems of this system, however, is that while density is increased, for certain applications, density is still insufficient. However, for some applications, it is necessary for each transmission contact element to be individually isolated.

The present invention concerns, in part, the design of a module which when combined with other modules provides a series of conductive chambers or pockets. A transmission contact element is positioned within each pocket. It is recognized that individual isolation, i.e., a coaxial isolation approach, is not new. Indeed such arrangements are disclosed in U.S. Pat. Nos. 4,571,014 and 5,620,340.

One of the problems with such connector systems is that the contact element density remains insufficient for certain applications. Consequently, a need still exists for a connector system which maximizes the number of individually isolated contact elements.

SUMMARY OF THE INVENTION

The above described problems are resolved and other advantages are achieved in an electrical shield, for shielding a series of conductors and which can be stacked with similarly constructed shields to form a header. The individual shield includes a base having an opening formed therein for the conductor. A first wall, integrally formed with said base, includes first and second panels. One edge of the first panel is attached to the base and one edge of the second panel is attached to the first panel. A lead is integrally formed with the first panel. A second wall is integrally formed with the base, so that a cavity is defined by the base, the first and second panels and the second wall.

In a preferred embodiment, the base further includes second and third openings. In such an embodiment, the shield further includes a third wall, integrally formed with the base, having third and fourth panels. One edge of the third panel is attached to the base and one edge of the fourth panel is attached to the third panel. Fourth and fifth walls are also integrally formed with the base. In this embodiment, a second cavity is defined by the base and the second, third and fourth panels and a third cavity is defined by the base, the fourth panel, the fourth wall and the fifth wall. One of the openings is located within each defined cavity.

In a still further embodiment, a tubular element is positioned to extend through the opening. In such an embodiment it is also preferred for electrical insulation to be positioned in the tube for insulating the conductor from the wall of the tube. It is also preferred for insulating material to be located in the cavity for insulating the conductor from the shield.

In an especially preferred embodiment of the invention, a header is formed for individually shielding an array of conductors. The header is formed from a plurality of shields arranged in a stacked or abutting relationship. Since each cavity formed in an individual shield is formed from three walls, an opening exists in the cavity. The abutting relationship of the shields results in a wall of one shield being located in the cavity opening of an adjacent shield, thereby closing the cavity.

BRIEF DESCRIPTION OF THE DRAWINGS

The present invention will be better understood and its numerous objects and advantages will become apparent by reference to the following detailed description of the invention when taken in conjunction with the following drawings, in which.

DETAILED DESCRIPTION OF THE INVENTION

Figure 1:
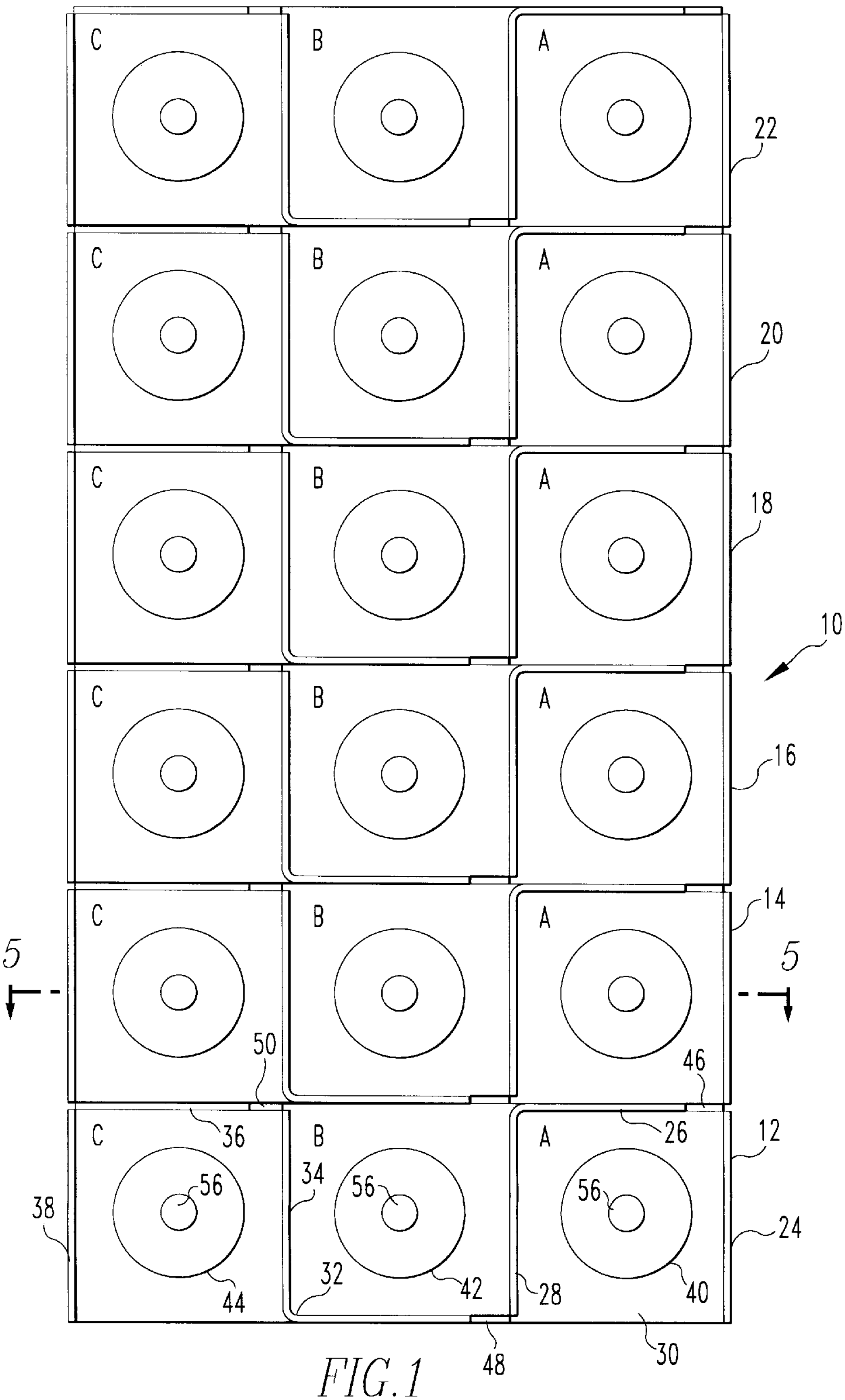
FIG. 1 is a bottom view of a header constructed from a series of modules in accordance with the present invention.

A header 10 constructed in accordance with the present invention is generally shown in FIG. 1. The header includes a series of shield modules 12–22 assembled in a stacked relationship to one another. Each module defines shield cavities A, B and C. Each cavity is defined by at least three walls. For example, cavity 12A is defined by walls 24, 26 and 28 and top wall 30. Cavity 12B is defined by upstanding walls 28, 32 and 34 and cavity 12C is defined by walls 34, 36 and 38. In the preferred embodiment, top wall 30 extends across the bottom of each cavity 12A, 12B and 12C. Bores 40, 42 and 44 are formed in top wall 30 within each of the cavities 12A, 12B and 12C, respectively. As shown, when modules are stacked together, wall 26 of cavity 12A and wall 36 of cavity 12C abut the adjacent openings in cavity 14A and cavity 14C, respectively, while wall 76 of cavity 14B abuts the adjacent opening in cavity 12B. As will be better appreciated in relation to later figures, walls 26, 32 and 36 further include leads 46, 48 and 50.

Figure 2:
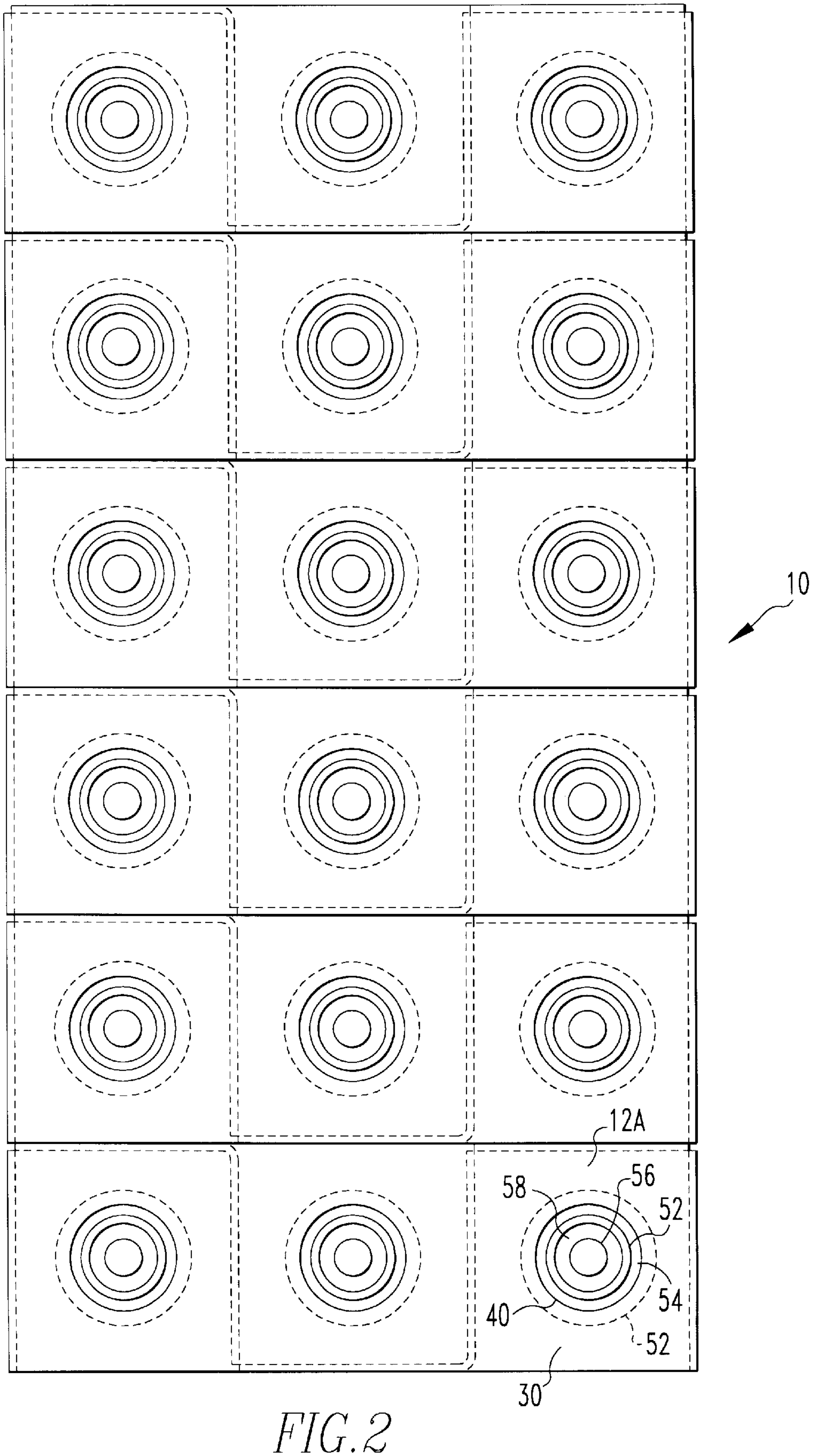
FIG. 2 is a bottom view of an alternative embodiment of the header depicted in FIG. 1, in which tubular elements have been incorporated.

Referring now to FIG. 2, the structure of the assembled shield modules is shown in greater detail. In particular, consider the top of cavity 12A. Top wall 30 is provided with a bore 40. In the preferred embodiment, a tubular element 52 or rivet is provided in the bore so that a small air gap 54 exists between the side wall of tubular element 52 and the inner surface of bore 40. A conductor 56 is also shown positioned within tubular element 52 such that an air gap 58 exists between conductor 56 and the interior surface of tubular element 52. As will be explained in greater detail hereinafter, the gap 58 is filled with a electrically insulating material.

Figure 3:
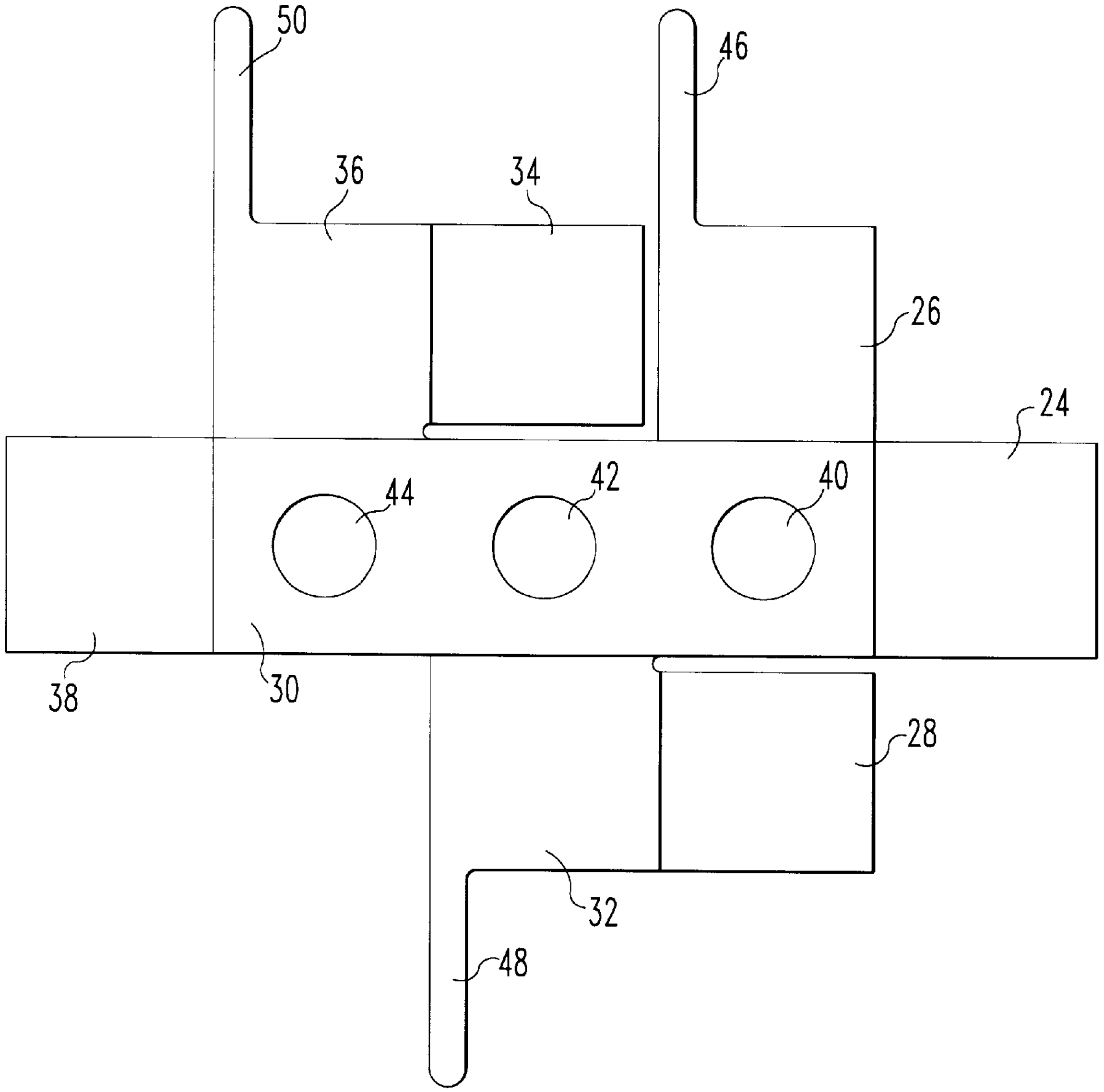
FIG. 3 is a plan view of a single stamped metal blank prior to being formed into a module in accordance with the present invention.

Referring now to FIG. 3, an individual shield module is shown in a flattened form. It is preferred for each of the shield modules to be stamped from a piece of flat metal stock in the shape shown in FIG. 3. After stamping the various components are folded in order to form a coaxial-type shield module. For example, the stamping shown in FIG. 3 is assembled by folding flaps 28 and 34 downward (out of the page). Flaps 26, 32 and 36 are also folded downwards as are flaps 24 and 38. Flaps 24–38 when folded as described, define the A, B and C cavities previously described. It will be appreciated that when folded each of the cavities has a side opening and a bottom opening, i.e. the cavity is only defined by three walls and a top wall. For example, cavities A and C will have an opening towards the bottom of the Figure while cavity B has an opening towards the top of the Figure. As can be appreciated from FIGS. 1 and 2, when the shield modules are stacked together all of the side openings are closed by an upstanding wall on an adjacent module. Only the very end modules, i.e. module 12 and 22 in FIG. 1, will have openings. Since all other conductors are shielded, it may or may not be necessary to close the openings thus provided.

Figure 4:
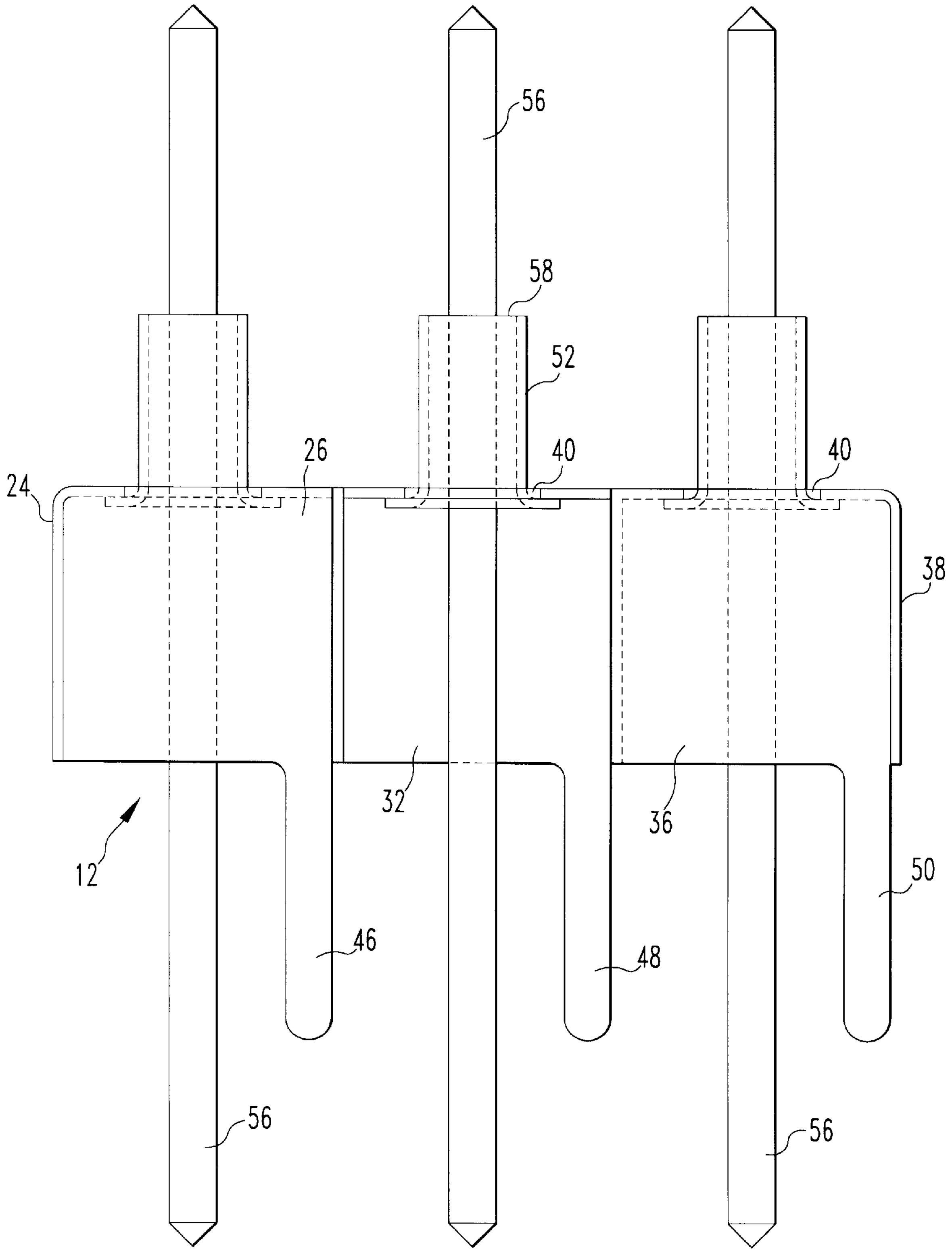
FIG. 4 is a front view of the header depicted in FIG. 1.

Referring now to FIG. 4, module 12 is shown in plan view. It will be noted that tubular element 52 is positioned within bore 40 and that conductors 56 are positioned so that a gap 58 is defined therebetween. It is also preferred for tubular elements 52 to be formed from conductive material and to be in electrical contact with the shield. In the preferred embodiment, the gap 58 and cavities A, B and C are filled with electrically insulating material. It is further noted that leads 46, 48 and 50 are designed to be connected to ground potential when the assembled module is connected to a printed circuit board. In this way, the entire shield body and tubular elements 52 are connected to the same potential, for example ground potential.

It is noted that the header of the present invention is preferrably used with a receptacle which provides electrical isolation or shielding to the terminals located in the receptacle. In such an embodiment, it is also preferred to electrically interconnect the receptacle shield and the shield body of header 10. Receptacles of this type are disclosed in U.S. application Ser. No. 08/992/082 filed Oct. 1, 1997 and entitled PUNCHED SHEET COAX HEADER titled SINGLE PIECE SHIELD FOR COAXIAL TYPE ISOLATION, both of which are incorporated herein by reference. Such use would result in the receptacle shielding making electrical contact with tubular element 52.

Figure 5:
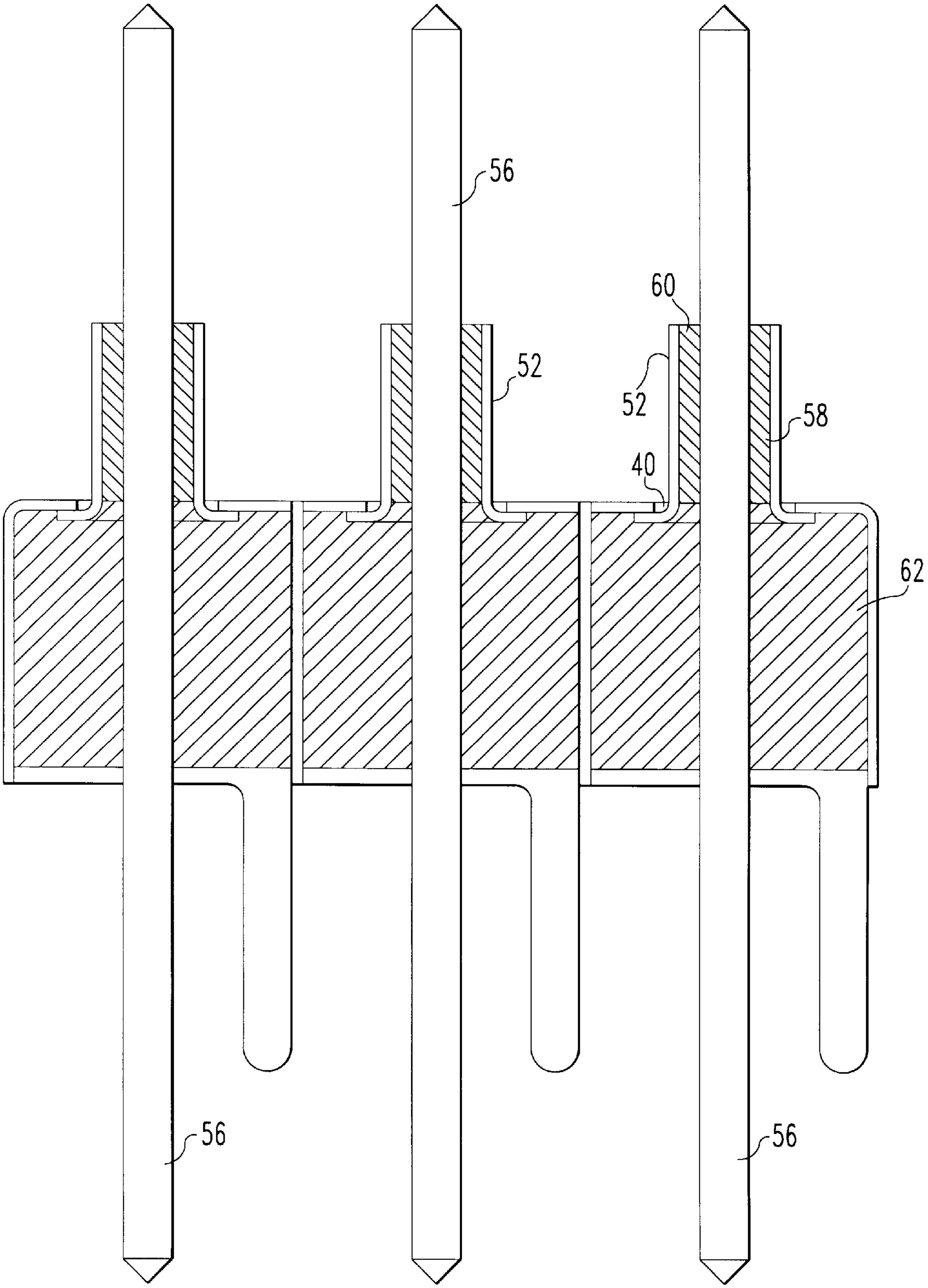
FIG. 5 is a sectional view taken along the line 5—5 in FIG. 1.

As shown in FIG. 5, gap 58 has been filled with insulating material 60. Cavities 12A, 12B and 12C have also been filled with insulating material. It is noted that plastic material can be molded into the cavities to insulate the conductor from the shield module material. A similar insulation result can be accomplished by molding plastic around the conductor first and then either potting or molding plastic in the cavities after the conductor has been inserted.

While the invention has been described and illustrated with reference to specific embodiments, those skilled in the art will recognize that modification and variations may be made without departing from the principles of the invention as described hereinabove and set forth in the following claims.

What is claimed is:

1. An electrical shield module, for use in shielding a conductor, said shield formed from a piece of conductive stock and comprising:

a base having an opening formed therein for the passage of a conductor;

a first wall, integrally formed with said base, having first and second panels, wherein one edge of said first panel is attached to said base and wherein one edge of said second panel is attached to said first panel;

a lead, integrally formed with said first panel; and a second wall, integrally formed with said base, wherein said first and second walls extend transversely to said base, and a cavity is defined by said base, said first and second panels and said second wall.

2. The shield module of claim 1, wherein said base further comprises second and third openings, said shield module further comprising:

a third wall, integrally formed with said base, having third and fourth panels, wherein one edge of said third panel is attached to said base and wherein one edge of said fourth panel is attached to said third panel;

a fourth wall, integrally formed with said base; and a fifth wall, integrally formed with said base, wherein a second cavity is defined by said base and said second, third and fourth panels and wherein a third cavity is defined by said base, said fourth panel, said fourth wall and said fifth wall, wherein each of said openings is positioned within a defined cavity.

3. The shield of claim 1, further comprising a tubular element positioned to extend through said opening.

4. The shield module of claim 3, further comprising electrical insulation positioned in said tubular element for insulating a conductor passing therethrough from said tubular element.

5. The shield module of claim 1, further comprising electrical insulation located in said cavity.

6. A header, for use in individually shielding an array of conductors, said header comprising:

a plurality of conductive shield modules arranged in abutting relationship, wherein each of said shield modules comprises:

a top wall having an opening formed therein for the passage of a conductor;

a first wall, integrally formed with said top wall, having first and second panels, wherein one edge of said first panel is attached to said top wall and wherein one edge of said second panel is attached to said first panel;

a lead, integrally formed with said first panel; and a second wall, integrally formed with said top wall, wherein a cavity is defined by said top wall, said first and second panels and said second wall, wherein said cavity includes a side opening;

wherein the first and second walls extend transversely to said top wall, and the abutting relationship of said shields results in a wall of one shield being located in the side opening of an adjacent shield.

7. The header as recited in claim 6, wherein said shield modules are formed from a piece of conductive stock.

8. The header as recited in claim 7, wherein said shield modules are stamped from said piece of conductive stock.

9. A box-shaped shield module for receiving a conductive element in an insertion direction, the shield module comprising:

a conductive top wall extending transversely to the insertion direction and having an opening therein for receiving the conductive element;

three conductive side walls positioned transversely to said top wall; and a lead extending from one of said three conductive side walls.

10. The shield module as recited in claim 9, wherein a first and a second of said three side walls are integral with said conductive top wall, a third of said three side walls integral with said first side wall.

11. The shield module as recited in claim 9, wherein said top wall, said side walls and said lead are formed from a piece of conductive stock.

12. The shield module as recited in claim 11, wherein said top wall, said side walls and said lead are stamped from said piece of conductive stock.

13. The shield module as recited in claim 9, in combination with:

an insulative insert positioned in said opening in said top wall; and a conductive element extending through said insulative insert;

wherein said insert separates said conductive element from said shield module.

14. The shield module as recited in claim 9, in combination with a second shield module placed adjacent said shield module so that a side wall of said second shield module, along with said three walls of said shield module, create an enclosure beneath said top wall of said shield module.

* * * * *